(12) United States Patent
Klubek et al.

(10) Patent No.: US 7,368,178 B2
(45) Date of Patent: May 6, 2008

(54) STABLE ORGANIC LIGHT-EMITTING DEVICES USING AMINOANTHRACENES

(75) Inventors: Kevin P. Klubek, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 372 days.

(21) Appl. No.: 10/753,249

(22) Filed: Jan. 8, 2004

(65) Prior Publication Data
US 2005/0153163 A1  Jul. 14, 2005

(51) Int. Cl.
*H01L 51/50* (2006.01)
(52) U.S. Cl. ............... 428/690; 428/917; 313/504; 313/506
(58) Field of Classification Search ............ 428/690, 428/917; 313/504, 506
See application file for complete search history.

(56) References Cited

U.S. PATENT DOCUMENTS

| | | | |
|---|---|---|---|
| 4,769,292 | A | 9/1988 | Tang et al. |
| 5,141,671 | A | 8/1992 | Bryan et al. |
| 5,281,489 | A * | 1/1994 | Mori et al. .............. 428/690 |
| 5,593,788 | A | 1/1997 | Shi et al. |
| 5,908,581 | A | 6/1999 | Chen et al. |
| 6,582,837 | B1 | 6/2003 | Toguchi et al. |
| 2003/0118866 | A1 * | 6/2003 | Oh et al. .................. 428/690 |
| 2004/0066139 | A1 * | 4/2004 | Hamada et al. ........... 313/506 |
| 2004/0247937 | A1 * | 12/2004 | Chen et al. .............. 428/690 |
| 2005/0064233 | A1 * | 3/2005 | Matsuura et al. ......... 428/690 |

FOREIGN PATENT DOCUMENTS

| | | |
|---|---|---|
| EP | 0765106 | 3/1997 |
| EP | 1 162 674 A2 | 5/2001 |
| JP | 11-273861 | 10/1999 |
| JP | 2001-284050 | 10/2001 |

OTHER PUBLICATIONS

Young et al., "Dipole Moments of Hole Transporting Materials and Their Influence on Hole Mobility in Molecularly Doped Polymers", J. Phys. Chem., (1995), vol. 99, p. 4230-4240.*
Dresner, RCA Review, 30, (1969), pp. 322-334.
Tang et al., Applied Physics Letters, 51, (1987), pp. 913-915.
Tang et al., Journal of Applied Physics, 65, (1989), pp. 3610-3616.
Popovic et al., Thin Solid Films 2000, 363, 6; SPIE 1998, 3476, pp. 68-73.
Hamada et al., Applied Phys. Lett. 75, (1999), pp. 1682-1684.

* cited by examiner

*Primary Examiner*—Dawn Garrett
(74) *Attorney, Agent, or Firm*—Raymond L. Owens (57) ABSTRACT

An organic light-emitting device includes a substrate, an anode, and a cathode disposed over the substrate, and a luminescent layer disposed between the anode and the cathode wherein the luminescent layer includes a host and at least one dopant. The host of the luminescent layer is selected to include a solid organic material comprising a mixture of at least two components, wherein the first component is an organic compound containing an aminoanthracene.

12 Claims, 3 Drawing Sheets

FIG. 5

STABLE ORGANIC LIGHT-EMITTING DEVICES USING AMINOANTHRACENES

CROSS REFERENCE TO RELATED APPLICATIONS

Reference is made to commonly assigned U.S. patent application Ser. No. 09/753,091 filed Jan. 2, 2001, now U.S. Pat. No. 6,720,090 by Ralph H. Young et al., entitled "Organic Light-Emitting Diode Devices With Improved Luminance Efficiency", the disclosure of which is herein incorporated by reference.

FIELD OF THE INVENTION

The present invention relates to organic light-emitting devices. More specifically, this invention relates to the design of the composition of the luminescent layer for improving device performance.

BACKGROUND OF THE INVENTION

Organic light-emitting diodes (OLED), also known as organic electroluminescent (EL) devices, are a class of electronic devices that emit light in response to an electrical current applied to the device. The structure of an OLED device generally includes an anode, an organic EL medium, and a cathode. The term, organic EL medium, herein refers to organic materials or layers of organic materials disposed between the anode and the cathode in the OLED device. The organic EL medium can include low molecular weight compounds, high molecular weight polymers, oligimers of low molecular weight compounds, or biomaterials, in the form of a thin film or a bulk solid. The medium can be amorphous or crystalline. Organic electroluminescent media of various structures have been described in the prior art. Dresner, in RCA Review, 30, 322 (1969), described a medium comprising a single layer of anthracene film. Tang et al., in Applied Physics Letters, 51, 913 (1987), Journal of Applied Physics, 65, 3610 (1989), and commonly assigned U.S. Pat. No. 4,769,292, reported an EL medium with a multilayer structure of organic thin films, and demonstrated highly efficient OLED devices using such a medium. In some OLED device structures the multilayer EL medium includes a hole-transport layer adjacent to the anode, an electron-transport layer adjacent to the cathode, and disposed in between these two layers, a luminescent layer. Furthermore, in some preferred device structures, the luminescent layer is constructed of a doped organic film comprising an organic material as the host and a small concentration of a fluorescent compound as the dopant. Improvements in EL efficiency, chromaticity, and stability have been obtained in these doped OLED devices by selecting an appropriate dopant-host composition. The dopant, being the dominant emissive center, is selected to produce the desirable EL colors. Examples of the doped luminescent layer reported by Tang et al. in commonly assigned U.S. Pat. No. 4,769,292 and by Chen et al. in commonly assigned U.S. Pat. No. 5,908,581 are tris(8-quinolinol)aluminum (AlQ) host doped with coumarin dyes for green-emitting OLEDs, and AlQ doped with 4-dicyanomethylene-4H-pyrans (DCMs) for orange-red-emitting OLEDs. Shi et al., in commonly assigned U.S. Pat. No. 5,593,788, disclosed that a long operational life was obtained in an OLED device by using a quinacridone compound as the dopant in an AlQ host. Bryan et al., in commonly assigned U.S. Pat. No. 5,141,671, disclosed a luminescent layer containing perylene or a perylene derivative as a dopant in a blue-emitting host. They showed that a blue-emitting OLED device with an improved operational stability was obtained. In both disclosures, the incorporation of selected fluorescent dopants in the luminescent layer is found to improve substantially the overall OLED device performance parameters. Codoping of luminescent layer with anthracene derivatives results in devices with better stability as shown in JP 11-273861 and JP 2001-284050. Doping the hole-transport layer with materials that impede hole-transport and codoping hole-transport materials into electron-transporting AlQ leads to the improved device lifetimes, Popovic et al. Thin Solid Films 2000, 363, 6; SPIE 1998, 3476, 68.

The most common formulation of the doped luminescent layer includes only a single dopant in a host matrix. However, in a few instances, incorporation of more than one dopant in the luminescent layer was found to be beneficial in improving the stability and hue. Using a luminescent layer containing rubrene, a yellow-emitting dopant, and DCJ, 4-(dicyanomethylene)-2-methyl-6-[2-(4-julolidyl)ethenyl]-4H-pyran, a red-emitting dopant, in an AlQ host, it is possible to produce a red-emitting OLED device with improved operational stability and excellent chromaticity, Hamada et al. in Applied Phys. Lett. 75, 1682 (1999); Hatwar et al. in EP 1 162 674 A2. With these multiple dopant systems, rubrene functions as a codopant in mediating energy transfer from the AlQ host to the DCJ emitter.

Although EL efficiency, color, and stability have been improved significantly using doped luminescent layers of various compositions, the problem of low operational stability persists. Insufficient stability presents one of the greatest obstacles for many desirable practical applications.

SUMMARY OF THE INVENTION

It is an object of the present invention to provide novel compositions for the light-emitting layer to increase lifetime and efficiencies of an OLED device.

This object is achieved by an organic light-emitting device, comprising a substrate, an anode, and a cathode disposed over the substrate, and a luminescent layer disposed between the anode and the cathode wherein the luminescent layer includes a host and at least one dopant, the host of the luminescent layer is selected to include a solid organic material comprising a mixture of at least two components, wherein the first component is an organic compound containing an aminoanthracene, and the second component of the mixture contains an organic compound having a dipole moment larger than that of the first component.

ADVANTAGES

An advantage of the present invention is that OLED devices with high operational stability, low drive voltage, and excellent luminance efficiency can be achieved.

It has been found, quite unexpectedly, that by selecting an aminoanthracene as the first component and choosing a second component that has a dipole moment larger than that of the first component, the light-emitting layer provides an increase in both lifetime and efficiency for an OLED device.

Another advantage of the present invention is that it provides OLED devices that are suitable for display applications.

BRIEF DESCRIPTION OF THE DRAWINGS

The drawings are necessarily of a schematic nature, since the individual layers are too thin and the thickness differences of the various elements too great to permit depiction to scale or to permit convenient proportionate scaling.

DETAILED DESCRIPTION OF THE INVENTION

Figure 1:
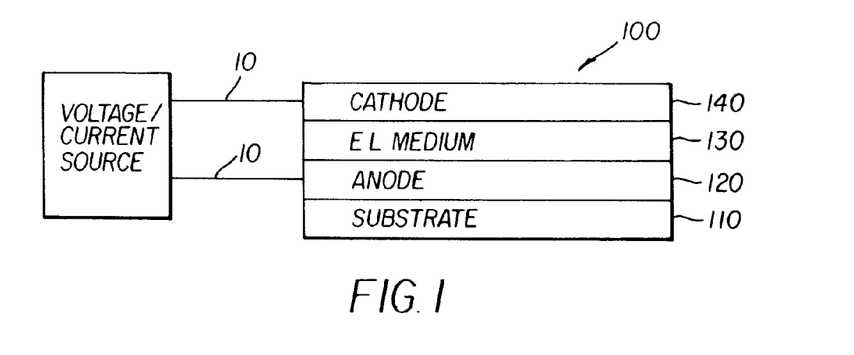
FIG. 1 is schematic structure of an OLED with an organic EL medium.

FIG. 1 illustrates the structure of an OLED device of the simplest construction practiced in the present invention. In this structure, OLED device 100 includes an anode 120, an EL medium 130, and a cathode 140, disposed upon a substrate 110. In operation, an electrical current is passed through the OLED by connecting an external current or voltage source with electrical conductors 10 to the anode and the cathode, causing light to be emitted from the EL medium. The light can exit through either the anode or the cathode or both as desired and depending on their optical transparencies. The EL medium includes a single layer or a multilayer of organic materials.

Figure 2:
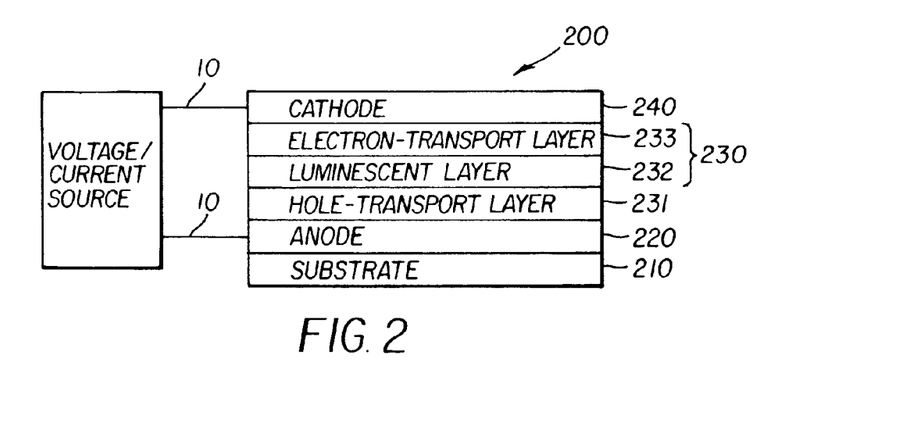
FIG. 2 and FIG. 3 are two schematic OLED structures showing two different configurations of the organic EL medium.

FIG. 2 illustrates the structure of another OLED device of the present invention. In this structure, OLED device 200 includes a substrate 210 and an EL medium 230, disposed between anode 220 and cathode 240. EL medium 230 includes a hole-transport layer 231 adjacent to the anode, an electron-transport layer 233 adjacent to the cathode, and a luminescent layer 232 disposed between the hole-transport layer and the electron-transport layer. In operation, an electrical current is passed through the OLED device by connecting an external current or voltage source with electrical conductors 10 to the anode and the cathode. This electrical current, passing through the EL medium, causes light to be emitted primarily from the luminescent layer 232. Hole-transport layer 231 carries the holes, that is, positive electronic charge carriers, from the anode to the luminescent layer. Electron-transport layer 233 carries the electrons, that is, negative electronic charge carriers, from the cathode to the luminescent layer 232. The recombination of holes and electrons produces light emission, that is, electroluminescence, from the luminescent layer 232.

Figure 3:
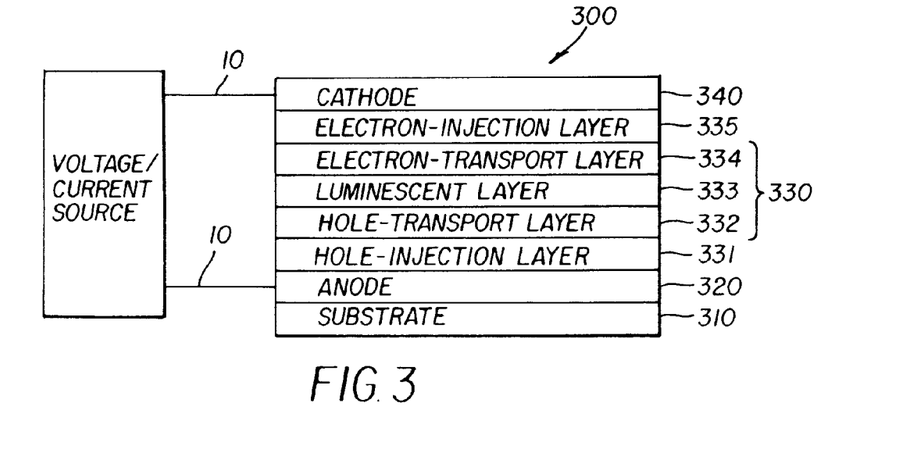

FIG. 3 illustrates yet another structure of an OLED device of the present invention. In this structure, OLED device 300 includes a substrate 310 and an EL medium 330 disposed between anode 320 and cathode 340. EL medium 330 includes a hole-injection layer 331, a hole-transport layer 332, a luminescent layer 333, an electron-transport layer 334, and an electron-injection layer 335. Similarly to OLED device 200 of FIG. 2, the recombination of electrons and holes produces emission primarily from the luminescent layer 333. The provision of the hole-injection layer 331 and the electron-injection layer 335 serves to reduce the barriers for carrier injection from the respective electrodes. Consequently, the drive voltage required for the OLED device can be reduced.

According to the present invention, the luminescent layer (either layer 232 of FIG. 2 or layer 333 of FIG. 3) is primarily responsible for the electroluminescence emitted from the OLED device. One of the most commonly used formulations for this luminescent layer is an organic thin film including a host and one or more dopants. The host serves as the solid medium or matrix for the transport and recombination of charge carriers injected from the anode and the cathode. The dopant, usually homogeneously distributed in the host in small quantity, provides the emission centers where light is generated. Following the teaching of the prior art, the present invention uses a luminescent layer including a host and a dopant, but it distinguishes over the prior art that the host of the present invention is a mixture having at least two components, each component having specific electronic properties. The selection of these host components and compatible dopant materials is in accordance with the following criteria:

1. The host is a solid organic thin film comprising a mixture of at least two components;
2. The first component of the mixture contains an aminoanthracene compound of the formula:

wherein:
$R_1$ to $R_{10}$ are individually hydrogen, fluoro, halogen, hydroxy, nitro, cyano, unbranched alkyl or substituted unbranched alkyl of from 1 to 24 carbon atoms, branched alkyl or substituted branched alkyl of from 1 to 24 carbon atoms, cyclic alkyl or substituted cyclic alkyl of from 1 to 24 carbon atoms, aryl or substituted aryl of from 5 to 40 carbon atoms, heterocyclic or substituted heterocyclic, alkenyl or substituted alkenyl, alkoxy or substituted alkoxy, aryloxy or substituted aryloxy, aromatic hydrocarbon or substituted aromatic hydrocarbon and at least one of $R_1$ to $R_{10}$ is diarylamino, arylalkylamino, or dialkylamino;

3. The second component of the mixture contains an organic compound having a dipole moment larger than that of the first component; and 4. The dopant is an organic luminescent compound capable of accepting the energy released from the recombination of electrons and holes in either the first or second host components, and emitting the energy as light.

Following the selection criteria of this invention, OLED devices have been constructed having low voltage, high efficiency, and excellent operational stability. More importantly, the operational stability and luminance efficiency measured in candelas per ampere significantly increase, compared to the system without the first component. In addition, the color chromaticity is retained while the drive voltage is reduced. This is a distinct advantage over the prior art, where such operational stability improvements combined with increased efficiencies over comparative examples have not been demonstrated. In fact, increases in operational stability are often accompanied by one or more side effects such as, a decrease in luminance, an increase in drive voltage or a change in color chromaticity.

Preferred materials for the first host component of the luminescent layer of this invention include aminoanthracene compounds of the formula:

wherein:

$R_1$ to $R_{10}$ are individually hydrogen, fluoro, halogen, hydroxy, nitro, cyano, unbranched alkyl or substituted unbranched alkyl of from 1 to 24 carbon atoms, branched alkyl or substituted branched alkyl of from 1 to 24 carbon atoms, cyclic alkyl or substituted cyclic alkyl of from 1 to 24 carbon atoms, aryl or substituted aryl of from 5 to 40 carbon atoms, heterocyclic or substituted heterocyclic, alkenyl or substituted alkenyl, alkoxy or substituted alkoxy, aryloxy or substituted aryloxy, aromatic hydrocarbon or substituted aromatic hydrocarbon and at least one of $R_1$ to $R_{10}$ is diarylamino, arylalkylamino, or dialkylamino.

The chemical formulas of specific examples of the particularly preferred materials include:

(I)

(II)

(III)

-continued (IV)

One particular selection criterion for the second host component is that the organic compound should have a molecular structure that is more polar than that of the first component. The polarity of a compound is a measure of the distribution of electrical charge in the molecule. A non-polar or substantially non-polar molecule has a structure wherein every atom is approximately electrically neutral. In contrast, a polar compound has a molecular structure wherein some atoms have a partial positive or negative charge. The polarity of a molecule can, in some instances, be indicated by the magnitude of the dipole moment, defined in units of Debye. For reference, the values of the dipole moments of a large number of organic compounds can be found in the Handbook of Chemistry and Physics, $51^{st}$ edition, page E70. A non-polar molecule usually has a dipole moment less than 1.0 Debye. The dipole moment of the first host component is preferably less than 2.5 Debye.

For some organic compounds, the molecular structure is such that the average dipole moment of the molecule can be relatively small even though the molecular structure can contain various moieties or group of atoms that are rather polar as individual groups. The reason is that the dipole moments of the individual moieties within the molecular structure can oppose each other, resulting in cancellation of these dipole moments. The values of the dipole moment of various groups of atoms within a molecule, known as group dipole moments, can be found in the book Dipole Moments in Organic Chemistry by V. I. Minkin, O. A. Osipov, and Y. A. Zhdanov. Further examples of the use of net and group dipole moments to describe the nonpolar or polar character of molecules useful in OLED are available in Young and Fitzgerald, Journal of Physical Chemistry, 99, 4230 (1995).

As used herein, the dipole moment of a moiety or a group of atoms within a molecule is referred to as the group dipole moment. The dipole moment of the entire molecule is termed the net dipole moment of the molecule.

Materials for the second host component of the luminescent layer of the present invention include organic compounds that have a dipole moment that is higher than that of the first host component. As defined previously, the values of the net dipole moment and the group dipole moment of a molecule can be quite different. For an organic compound to be useful as the second host component, it is only necessary that any individual group dipole moment or net dipole moment of the molecule be greater than any individual group dipole moment or net dipole moment of the molecule used for the first host component. The value of 2.5 Debye or larger is preferred for the individual group or net dipole moment for molecules useful as the second host component in the luminescent layer. Table 1 lists the dipole moments for several materials useful in the present invention. Geometries and dipole moments were calculated using the B3LYP/MIDI! method. B3LYP was used as defined in the Gaussian98 computer code. The dipole used was the wave function dipole.

TABLE I

| Compound | Dipole Moment (debye) |
|---|---|
| Alq | 5.06 |
| (I) | 1.67 |
| (II) | 1.63 |
| (III) | 1.29 |
| (IV) | 1.73 |

The preferred class of materials for the second host component is the oxinoid compounds. Exemplary of contemplated oxinoid compounds are those satisfying the following structural formula:

wherein:

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, rubidium, cesium, or potassium; an alkaline earth metal, such as magnesium, strontium, barium, or calcium; or an earth metal, such as boron or aluminum, gallium, and indium. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds and their abbreviated names are the following:

Tris(8-quinolinol)aluminum (AlQ$_3$);

Bis(8-quinolinol)magnesium (MgQ$_2$);

Tris(8-quinolinol)gallium (GaQ$_3$); and 8-quinolinol lithium (LiQ).

The list further includes InQ$_3$, ScQ$_3$, ZnQ$_2$, BeBq$_2$ (bis(10-hydroxybenzo[h]quinolinato)beryllium), Al(4-MeQ)$_3$, Al(2-MeQ)$_3$, Al(2,4-Me$_2$Q)$_3$, Ga(4-MeQ)$_3$, Ga(2-MeQ)$_3$, Ga(2,4-Me$_2$Q)$_3$, and Mg(2-MeQ)$_2$. The list of oxinoid compounds further includes metal complexes with two bi-dentate ligands and one mono-dentate ligand, for example Al(2-MeQ)$_2$(X) where X is any aryloxy, alkoxy, arylcaboxylate, and heterocyclic carboxylate group.

The material selection criteria for the dopant in the luminescent layer are: 1) the dopant molecule has a high efficiency of fluorescence or phosphorescence in the luminescent layer; and 2) it has a bandgap smaller than that of both the first and second host materials. Furthermore, the dopant selected can produce blue, blue-green, green, green-yellow, or yellow light.

For green-emitting OLEDs, a class of fluorescent materials is useful as the dopants in the present invention, which includes coumarin dyes of the formula:

wherein:

X=S, O, or NR$_7$; R$_1$ and R$_2$ are individually alkyl of from 1 to 20 carbon atoms, aryl or carbocyclic systems;

R$_3$ and R$_4$ are individually alkyl of from 1 to 10 carbon atoms, or a branched or unbranched 5 or 6 member substituent ring connecting with R$_1$ and R$_2$, respectively;

R$_5$ and R$_6$ are individually alkyl of from 1 to 20 carbon atoms, which are branched or unbranched; and R$_7$ is any alkyl or aryl group.

These materials possess fluorescence efficiencies as high as unity in solutions. Representative materials of this class and their abbreviated names include:

C-545T

C-6

C-525T

For green-emitting OLEDs, another class of fluorescent materials is useful as the dopants in the present invention, which includes compounds having a quinacridone dyes of the formula:

wherein:

substituents $R_1$ through $R_7$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_4$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_4$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class and their abbreviated names include:

Quinacridone, QA

Dimethylquinacridone, DMQA

Diphenylquinacridone, DPQA

CFDMQA

For green, green-yellow, and yellow-emitting OLEDs, another class of fluorescent materials is useful as the dopants in the present invention, which includes compounds having a DPMB (dipyridinomethene borate) moiety:

wherein:

substituents $R_1$ through $R_9$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_9$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_9$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

DPMB 1

DPMB 2

DPMB 3

For yellow- and orange-emitting OLEDs, a preferred class of dopants for this invention includes compounds having an indenoperylene moiety:

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. One representative material of this class is:

Yellow-green 2

For yellow- and orange-emitting OLEDs, another preferred class of dopants for this invention includes compounds having a naphthacene moiety:

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

For green-blue, blue-green, and blue-emitting OLEDs, a preferred class of dopants for this invention includes compounds having a BASB (bisaminostyrylbenzene) moiety:

wherein:
each double bond can be either E or Z independently of the other double bond; substituents $R_1$ through $R_4$ are each individually and independently alkyl of from 1 to 24 carbon atoms, aryl, or substituted aryl of from 5 to 30 carbon atoms, heterocycle containing at least one nitrogen atom, or at least one oxygen atom, or at least one sulfur atom, or at least one boron atom, or at least one phosphorus atom, or at least one silicon atom, or any combination thereof; and substituents $R_5$ through $R_{20}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_5$ through $R_{20}$ substituents form an annelated benzo-, naphtho-, anthra-, phenanthro-, fluorantheno-, pyreno-, triphenyleno-, or peryleno-substituent or its alkyl or aryl substituted derivative; or any two $R_5$ through $R_{20}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

4-(Diphenylamino)-4'-[4-(diphenylamino)styryl]stilbene;
4-(Di-p-Tolylamino)-4'-[(di-p-tolylamino)styryl]stilbene (Blue-green 2);
4,4'-[(2,5-Dimethoxy-1,4-phenylene)di-2,1-ethenediyl]bis[N,N-bis(4-methylphenyl)benzenamine;
4,4'-(1,4-Naphthalenediyldi-2,1-ethenediyl)bis[N,N-bis(4-methylphenyl)benzenamine;
3,3'-(1,4-Phenylenedi-2,1-ethenediyl)bis[9-(4-ethylphenyl)-9H-carbazole;
4,4'-(1,4-Phenylenedi-2,1-ethenediyl)bis[N,N-diphenyl-1-naphthalenamine;
4,4'-[1,4-Phenylenebis(2-phenyl-2,1-ethenediyl)]bis[N,N-diphenylbenzenamine];
4,4',4''-(1,2,4-Benzenetriyltri-2,1-ethenediyl)tris[N,N-diphenylbenzenamine];
9,10-Bis[4-(di-p-tolylamino)styryl]anthracene; or
α,α'-(1,4-Phenylenedimethylidyne)bis[4-(diphenylamino)-1-naphthaleneacetonitrile.

For blue-emitting OLEDs, a preferred class of dopants for this invention includes compounds having a perylene moiety:

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:
Perylene;
2,5,8,11-Tetra-tert-butylperylene (TBP);
2,8-Di-tert-Butylperylene;
Ovalene;
Dibenzo[b,ghi]perylene; and
Dibenzo[b,k]perylene.

For blue-emitting OLEDs, another preferred class of dopants for this invention includes compounds having a ADPMB (aza-DPMB) moiety:

wherein:
substituents $R_1$ through $R_8$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_8$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_8$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

Blue 2

ADPMB 1

ADPMB 2

The composition of the luminescent layer of this invention is such that either the first host component or the second host component can constitute the largest volume fraction of the luminescent layer. The dopant usually constitutes the smallest volume fraction. The range for the first host component is from 1 to 99% by volume of the luminescent layer. The preferred range for the first host component is from 25 to 75% by volume. The range for the second host component is from 99 to 1% by volume of the luminescent layer. The preferred range for the second host component is from 75 to 25% by volume. The concentration range for the dopant is from 0.1% to 10% by volume. The preferred concentration range for the dopant is from 0.5% to 5% by volume. The thickness of the luminescent layer useful in this invention is between 50 Angstroms and 5000 Angstroms. A thickness in this range is sufficiently large to enable recombination of charge carriers and, therefore, electroluminescence to take place exclusively in this layer. A preferred range is between 100 Angstroms and 1000 Angstroms, where the overall OLED device performance parameters, including drive voltage, are optimal.

A useful method for forming the luminescent layer of the present invention is by vapor deposition in a vacuum chamber. This method is particularly useful for fabricating OLED devices, where the layer structure, including the organic layers, can be sequentially deposited on a substrate without significant interference among the layers. The thickness of each individual layer and its composition can be precisely controlled in the deposition process. To produce the desired composition of the luminescent layer, the rate of deposition for each component is independently controlled using a deposition rate monitor.

Another useful method for forming the luminescent layer of the present invention is by spin-coating or by ink-jet printing. This method is particularly useful for fabricating lower-cost OLED devices. Composition of the luminescent layer is determined by the concentration of each component in the solutions being coated.

Returning to FIG. 2, hole-transport layer 231 and electron-transport layer 233 provide the functions of transporting holes and electrons, respectively, to the luminescent layer 232. The use of these layers and their material compositions in OLED devices have been disclosed by Tang et al. in commonly assigned U.S. Pat. No. 4,769,292, included herein by reference. A typical hole-transport layer includes hole-transporting compounds such as N,N'-bis(1-naphthyl)-N,N'-diphenylbenzidine (NPB), N,N'-bis(1-naphthyl)-N,N'-bis(2-naphthyl)benzidine (TNB), and N,N'-bis(3-tolyl)-N,N'-diphenylbenzidine (TPD).

Returning to FIG. 3, hole-injection layer 331 and electron-injection layer 335 provide the functions of improving the hole-injection from the anode and electron-injection from the cathode 340, respectively. The use of a hole-injection layer in OLED devices has been disclosed by Van Slyke et al. in commonly assigned U.S. Pat. No. 4,720,432, included herein by reference. The use of an electron-injection layer has been disclosed by Hung et al. in commonly assigned U.S. Pat. No. 5,776,622, also included herein by reference.

Aminoanthracenes can be synthesized by a variety of ways. One particular way is outlined below in the synthetic scheme. In this example, 9-bromoanthracene is coupled with a particular aryl group using Suzuki Cross Coupling to form arylanthracene (a). Arylanthracene (a) is brominated to give (b). Arylanthracene (b) undergoes Pd catalyzed cross coupling with an amine to give aminoanthracene (c) which is useful in the present invention.

Synthetic Scheme

Synthesis of Compounds I-IV

9-(2-naphthylenyl)anthracene 9-bromoanthracene (25.0 g, 0.088 mol), 2-naphthylboronic acid (17.1 g, 0.099 mol), tetrakis(triphenylphosphine)palladium(0) (0.7 g), 300 ml toluene and 150 ml potassium carbonate (2N) were all added to a round bottom flask under a nitrogen atmosphere. Reaction was heated at reflux for two days. Thin layer chromatography (TLC), using Hexane:Dichloromethane (6:1 ratio) as eluent showed 9-bromoanthracene was no longer present. Reaction cooled to room temperature and gray solid collected by filtration and washed very well with water. This solid was heated lightly in HCl (6M) for 2 hours after which the solid was collected by filtration, washed well with water and dried. Gray solid suspended in dichloromethane and heated gently. Suspension filtered and washed well with dichloromethane. Filtrate is rotary evaporated and the resulting yellow solid is sonicated in diethyl ether for 60 minutes. The yellow solid is collected by filtration, washed with diethyl ether and then dried in oven to yield 16.7 g (62% yield) of pure yellow product. FD-MS (m/z): 304.

9-bromo-10-(2-naphthylenyl)anthracene 9-(2-naphthylenyl)anthracene (24.5 g, 0.081 mol) was dissolved in 400 ml dichloromethane. Bromine (13.0 g, 0.081 mol) dissolved in 100 ml dichloromethane was added dropwise over 30 minutes and solution was stirred at room temperature overnight. Dichloromethane is removed by rotary evaporation and methanol (250 ml) is added to the flask. Suspension is filtered and yellow solid is washed with methanol and dried to yield 30 g (97% yield) of pure yellow product. FD-MS (m/z): 383.

N,10-(2-naphthalenyl)-N'-phenyl-9-anthraceneamine (I)

9-bromo-10-(2-naphthylenyl)anthracene (5.0 g, 0.013 mol), N-phenyl-2-naphthylamine (3.2 g, 0.014 mol), 1.75 g sodium tert-butoxide, 0.16 g palladium(II) acetate, 2 drops tri-tert-butylphosphine and 25 ml o-xylene are added to a round bottom flask under a nitrogen atmosphere. Mixture heated at 100° C. overnight. After cooling to room temperature, insoluble materials are filtered off. Xylene is distilled away and remaining solid is chromatographer on a silica gel column to yield 6.0 g (88% yield) of pure yellow product. FD-MS (m/z): 521.

N,10-phenyl-N'-(2-naphthalenyl)-9-anthraceneamine (II)

9-bromo-10-phenylanthracene (1.5 g, 0.005 mol), N-phenyl-2-naphthylamine (0.005 mol), 0.5 g sodium tert-butoxide, 0.1 g palladium(II) acetate, 2 drops tri-tert-butylphosphine and 40 ml toluene are added to a round bottom flask under a nitrogen atmosphere. Mixture heated at reflux for 2 days. After cooling, toluene removed by rotary evaporation and remaining solid chromatographer on a silica gel column to yield 1.6 g (75% yield) of pure yellow product. FD-MS (m/z): 471.

10-(2-naphthalenyl)-N,N-diphenyl-9-anthraceneamine (III)

9-bromo-10-(2-naphthylenyl)anthracene (3.3 g, 0.008 mol), diphenylamine (1.5 g, 0.008 mol), 1.0 g sodium tert-butoxide, 0.1 g palladium(II) acetate, 3 drops tri-tert-butylphosphine and 80 ml toluene are added to a round bottom flask under a nitrogen atmosphere. Mixture heated at reflux for 2 days. After cooling, toluene removed by rotary evaporation and remaining solid chromatographer on a silica gel column to yield 4.0 g (99% yield) of pure yellow product. FD-MS (m/z): 471.

10-[1,1'-biphenyl]-4-yl-N-phenyl-N'-(2-naphthalenyl)-9-anthraceneamin (IV)

9-bromo-10-[1,1'-biphenyl]-4-yl-anthracene (7.0 g, 0.017 mol), N-phenyl-2-naphthylamine (3.5 g, 0.017 mol), 2.7 g sodium tert-butoxide, 1.0 g palladium(II) acetate, 6 drops tri-tert-butylphosphine and 120 ml toluene are added to a round bottom flask under a nitrogen atmosphere. Mixture heated at reflux for 1 day. After cooling, methanol added and solid collected by filtration and dried. Solid was chromatographer on a silica gel column to yield 7.0 g (75% yield) of pure yellow product. FD-MS (m/z): 547.

WORKING DEVICE EXAMPLES 1-7

The present invention and its advantages can be better appreciated by the following inventive and comparative examples. In these examples, the thickness of the organic layers and the doping concentration were controlled and measured in situ using calibrated thickness monitors (INFI- CON IC/5 Deposition Controller). The electroluminescence characteristics of all the fabricated devices were evaluated using a constant current source (KEITHLEY 2400 SourceMeter) and a photometer (PHOTO RESEARCH SpectraScan PR 650) at room temperature.

Example 1

Comparative Example

The preparation of a conventional OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing $CHF_3$ gas in an RF plasma treatment chamber. The substrate was then transferred into a vacuum deposition chamber (TROVATO MFG. INC) for deposition of all other layers on top of the substrate.

The following layers were deposited in the following sequence by evaporation from a heated boat under a vacuum of approximately $10^{-6}$ Torr: (1) a hole-transport layer, 75 nm thick, including NPB; (2) a luminescent layer, 37.5 nm thick, including Alq as the sole host material and 0.6% DPQA as the dopant; (3) an electron-transport layer, 37.5 nm thick, including $AlQ_3$; and (4) a cathode, approximately 2100 nm thick, including an alloy of magnesium and silver with a Mg:Ag volume ratio of about 10:0.5.

After the deposition of these layers, the device was transferred from the deposition chamber into a dry box (VAC Vacuum Atmosphere Company) for encapsulation.

The EL characteristics of this device were evaluated using a constant current source and a photometer. The drive voltage, luminance in $cd/m^2$, EL efficiency in cd/A, and Commission Internationale de l'Eclairage (CIE) coordinates were all measured. Their values are shown in Table II. This device requires a drive voltage of 8.6 V to pass 20 $mA/cm^2$. Its luminance is 1756 $cd/m^2$ and its luminance efficiency is 8.8 cd/A. The fabricated device was operated at 20 $mA/cm^2$ at room temperature for operational stability testing. The resulting luminance decay vs. operational time is shown in both FIGS. 4 and 5. After 300 hours operation, the luminance dropped by 13%.

Example 2

Inventive Example

Figure 4:
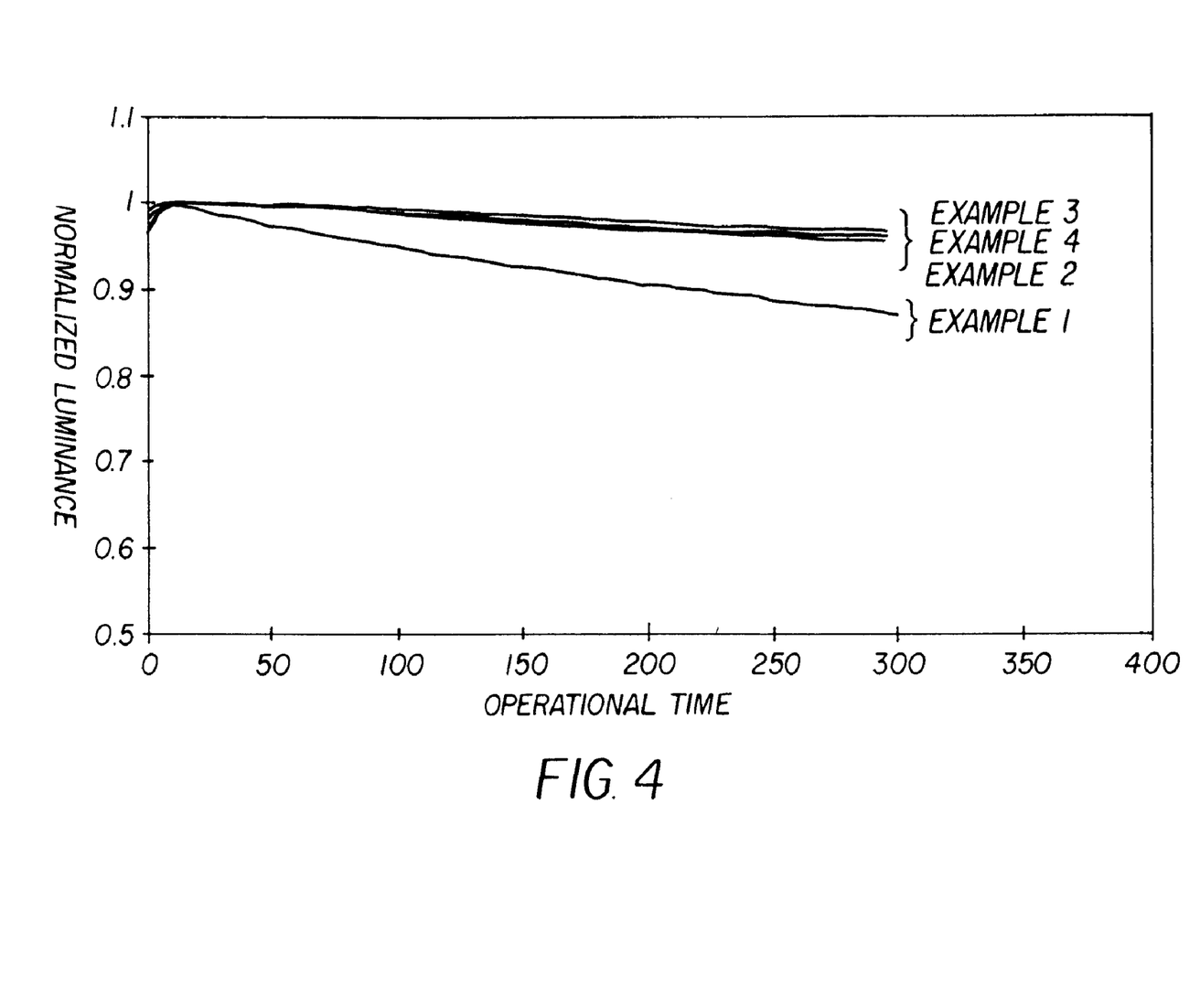
FIG. 4 is a graph of normalized luminance vs. operational time for comparative Example 1 and for device Examples 2-4 in accordance with the present invention. All devices were operated at a constant current density of 20 mA/cm$^2$ and at room temperature.

An OLED device similar to that of Comparative Example 1 was constructed, except that in the luminescent layer, Compound I is the material for the first host component, Alq is the material for the second host component, and DPQA is the fluorescent dopant. The relative amounts of Compound I, Alq, and DPQA on a volume basis are in the ratio 25.2:74.2:0.6. The EL characteristics of this device are also shown in Table II. This device requires a drive voltage of 8.3 V to pass 20 $mA/cm^2$. Its luminance is 1857 $cd/m^2$ and its luminance efficiency is 9.3 cd/A. When compared to Example 1, the efficiency is slightly higher and the voltage is lower. Luminance decay vs. operational time is shown in FIG. 4. After 300 hours operation, the luminance dropped by only about 5%.

Example 3

Inventive Example

An OLED device similar to that of Comparative Example 1 was constructed, except that in the luminescent layer, Compound I is the material for the first host component, Alq is the material for the second host component, and DPQA is the fluorescent dopant. The relative amounts of Compound I, Alq, and DPQA on a volume basis are in the ratio 50.7:48.7:0.6. The EL characteristics of this device are also shown in Table II. This device requires a drive voltage of 7.6 V to pass 20 $mA/cm^2$. Its luminance is 2103 $cd/m^2$ and its luminance efficiency is 10.5 cd/A. When compared to Example 1, the efficiency is significantly higher and the voltage is quite lower. Luminance decay vs. operational time is shown in FIG. 4. After 300 hours operation, the luminance dropped by only about 4%.

Example 4

Inventive Example

An OLED device similar to that of Comparative Example 1 was constructed, except that in the luminescent layer, Compound I is the material for the first host component, Alq is the material for the second host component, and DPQA is the fluorescent dopant. The relative amounts of Compound I, Alq, and DPQA on a volume basis are in the ratio 75.8:23.6:0.6. The EL characteristics of this device are also shown in Table II. This device requires a drive voltage of 7.4 V to pass 20 $mA/cm^2$. Its luminance is 2019 $cd/m^2$ and its luminance efficiency is 10.1 cd/A. When compared to Example 1, the efficiency is significantly higher and the voltage is quite lower. Luminance decay vs. operational time is shown in FIG. 4. After 300 hours operation, the luminance dropped by only about 4%.

Example 5

Inventive Example

Figure 5:
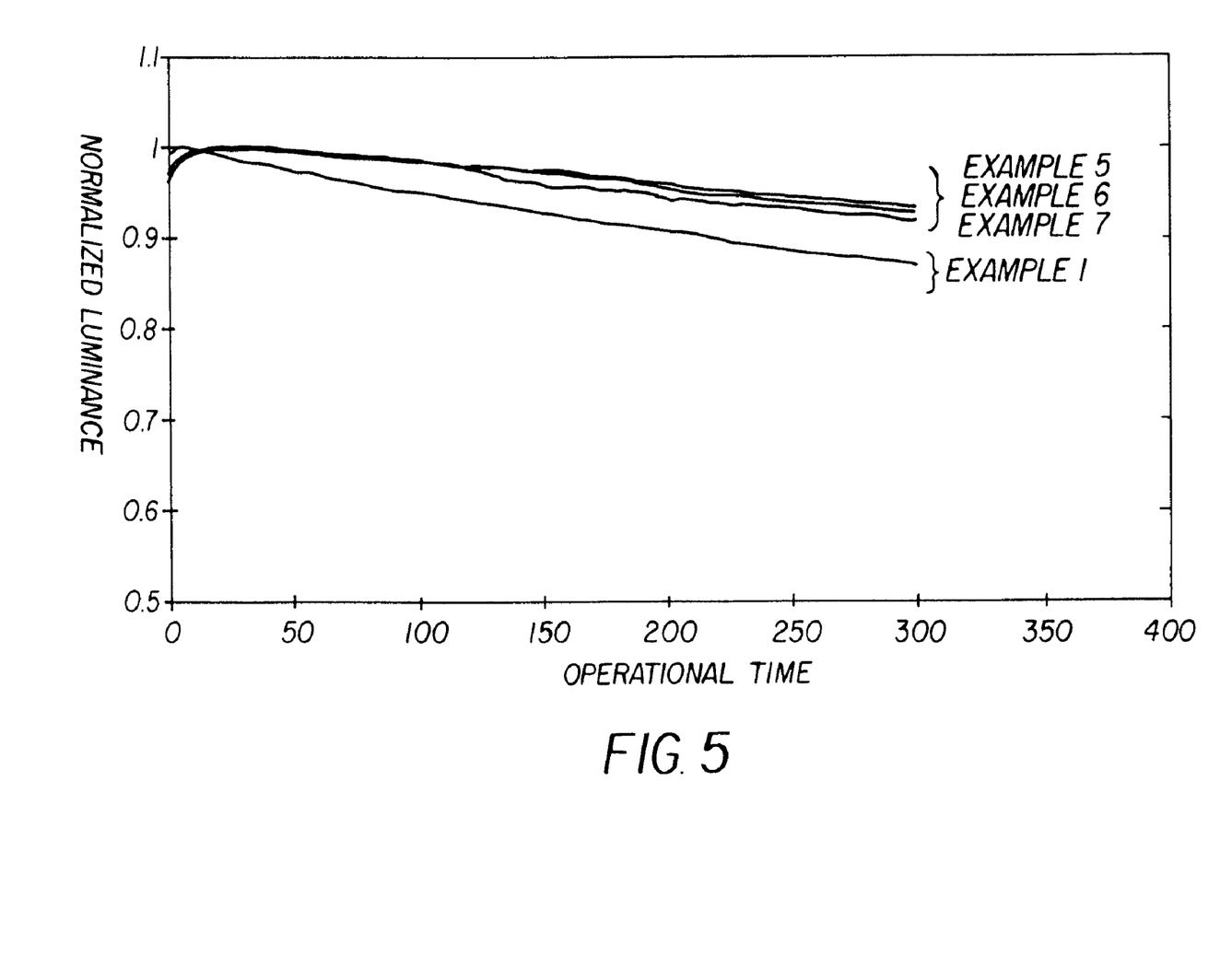
FIG. 5 is a graph of normalized luminance vs. operational time for comparative Example 1 and for device Examples 5-7 in accordance with the present invention. All devices were operated at a constant current density of 20 mA/cm$^2$ and at room temperature.

An OLED device similar to that of Comparative Example 1 was constructed, except that in the luminescent layer, Compound II is the material for the first host component, Alq is the material for the second host component, and DPQA is the fluorescent dopant. The relative amounts of Compound II, Alq, and DPQA on a volume basis are in the ratio 75.6:23.8:0.6. The EL characteristics of this device are also shown in Table II. This device requires a drive voltage of 7.7 V to pass 20 $mA/cm^2$. Its luminance is 1706 $cd/m^2$ and its luminance efficiency is 8.5 cd/A. When compared to Example 1, the efficiency is approximately the same and the voltage is lower. Luminance decay vs. operational time is shown in FIG. 5. After 300 hours operation, the luminance dropped by only about 7%.

Example 6

Inventive Example

An OLED device similar to that of Comparative Example 1 was constructed, except that in the luminescent layer, Compound II is the material for the first host component, Alq is the material for the second host component, and DPQA is the fluorescent dopant. The relative amounts of Compound II, Alq, and DPQA on a volume basis are in the ratio 54.2:45.2:0.6. The EL characteristics of this device are also shown in Table II. This device requires a drive voltage of 7.0 V to pass 20 mA/cm². Its luminance is 1880 cd/m² and its luminance efficiency is 9.4 cd/A. When compared to Example 1, the efficiency has increased and the voltage is considerably lower. Luminance decay vs. operational time is shown in FIG. 5. After 300 hours operation, the luminance dropped by only about 7%.

Example 7

Inventive Example

An OLED device similar to that of Comparative Example 1 was constructed, except that in the luminescent layer, Compound II is the material for the first host component, Alq is the material for the second host component, and DPQA is the fluorescent dopant. The relative amounts of Compound II, Alq, and DPQA on a volume basis are in the ratio 38.1:61.3:0.6. The EL characteristics of this device are also shown in Table II. This device requires a drive voltage of 6.9 V to pass 20 mA/cm². Its luminance is 1913 cd/m² and its luminance efficiency is 9.6 cd/A. When compared to Example 1, the efficiency has increased and the voltage is considerably lower. Luminance decay vs. operational time is shown in FIG. 5. After 300 hours operation, the luminance dropped by only 8%.

TABLE II

| Example | voltage (V) | luminance (cd/m²) | efficiency (cd/A) | $CIE_{x,y}$ | luminance loss after 300 hrs. |
|---|---|---|---|---|---|
| 1 (comparative) | 8.6 | 1756 | 8.8 | 0.31, 0.65 | 13% |
| 2 (inventive) | 8.3 | 1857 | 9.3 | 0.31, 0.65 | 5% |
| 3 (inventive) | 7.6 | 2103 | 10.5 | 0.30, 0.65 | 4% |
| 4 (inventive) | 7.4 | 2019 | 10.1 | 0.30, 0.65 | 4% |
| 5 (inventive) | 7.7 | 1706 | 8.5 | 0.31, 0.65 | 7% |
| 6 (inventive) | 7.0 | 1880 | 9.4 | 0.31, 0.65 | 7% |
| 7 (inventive) | 6.9 | 1913 | 9.6 | 0.30, 0.64 | 8% |

The above examples demonstrate the tremendous improvements in voltage, efficiency and stability that are achieved when the host of the luminescent layer is selected to include a solid organic material comprising a mixture of at least two components, wherein the first component is an organic compound containing an aminoanthracene. Additionally, as is evident from the CIE coordinates, the color purity of the device is retained when the host of the luminescent layer includes an aminoanthracene.

The entire contents of the patents and other publications referred to in this specification are incorporated herein by reference.

The invention has been described in detail with particular reference to certain preferred embodiments thereof, but it will be understood that variations and modifications can be effected within the spirit and scope of the invention.

PARTS LIST 10 electrical conductors
100 OLED device
110 substrate
120 anode
130 EL medium
140 cathode
200 OLED device
210 substrate
220 anode
230 EL medium
231 hole-transport layer
232 luminescent layer
233 electron-transport layer
240 cathode
300 OLED device
310 substrate
320 anode
330 EL medium
331 hole-injection layer
332 hole-transport layer
333 luminescent layer
334 electron-transport layer
335 electron-injection layer
340 cathode

What is claimed is:
1. An organic light-emitting device, comprising:
a) a substrate;
b) an anode and a cathode disposed over the substrate;
c) a luminescent layer disposed between the anode and the cathode wherein the luminescent layer includes a host and at least one dopant;
d) the host of the luminescent layer being selected to include a solid organic material comprising a mixture of at least two components wherein:
i) the first component of the mixture contains a non-emissive aminoanthracene compound of the formula:

wherein:
$R_1$ to $R_9$ are individually hydrogen, fluoro, halogen, hydroxy, nitro, cyano, unbranched alkyl or substituted unbranched alkyl of from 1 to 24 carbon atoms, branched alkyl or substituted branched alkyl of from 1 to 24 carbon atoms, cyclic alkyl or substituted cyclic alkyl of from 1 to 24 carbon atoms, aryl or substituted aryl of from 5 to 40 carbon atoms, heterocyclic or substituted heterocyclic, alkenyl or substituted alkenyl, alkoxy or substituted alkoxy, aryloxy or substituted aryloxy, aromatic hydrocarbon or substituted aromatic hydrocarbon; $Ar_1$ and $Ar_2$ are individually aryl or substituted aryl of from 5 to 40 carbon atom; and
ii) the second component of the mixture contains an organic compound having a dipole moment larger than that of the first component; and
e) the dopant of the luminescent layer having a bandgap smaller than that of both the first and second components of the host and providing emission centers wherein the dopant produces blue, blue-green, green, green-yellow, or yellow light.
2. The organic light-emitting device of claim 1 wherein the first component of the host constitutes at least 1% by volume of the luminescent layer.
3. The organic light-emitting device of claim 1 wherein the first component of the host constitutes preferably 25-75% by volume of the luminescent layer.

4. The organic light-emitting device of claim 1 wherein the second component includes an oxinoid compound.

5. The organic light-emitting device of claim 4 wherein the second component includes AlQ$_3$.

6. The organic light-emitting device of claim 1 wherein the second component of the host constitutes preferably 75-25% by volume of the luminescent layer.

7. The organic light-emitting device of claim 1 wherein the dopant concentration in the luminescent layer is between 0.1 and 10% by volume.

8. The organic light-emitting device of claim 1 wherein the dopant includes a coumarin dye.

9. The organic light-emitting device of claim 8 wherein the dopant includes C-6, C-545T, or C-525T.

10. The organic light-emitting device of claim 1 wherein the dopant includes a quinacridone dye.

11. The organic light-emitting device of claim 10 wherein the dopant includes QA, DMQA, CFDMQA, or DPQA.

12. The organic light-emitting device of claim 1 wherein the first component of the host includes a compound of the formula:

* * * * *